(12) United States Patent
Deng et al.

(10) Patent No.: US 7,612,616 B2
(45) Date of Patent: Nov. 3, 2009

(54) LOW-NOISE AMPLIFIER

(75) Inventors: Ping-Yuan Deng, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 23 days.

(21) Appl. No.: 12/137,641

(22) Filed: Jun. 12, 2008

(65) Prior Publication Data

US 2009/0189696 A1  Jul. 30, 2009

(30) Foreign Application Priority Data

Jan. 25, 2008 (TW) .............................. 97102784 A

(51) Int. Cl.
  *H03F 3/04* (2006.01)
(52) U.S. Cl. ..................... 330/302; 330/310; 330/253
(58) Field of Classification Search ................. 330/302, 330/310, 253

See application file for complete search history.

(56) References Cited

U.S. PATENT DOCUMENTS

| | | | |
|---|---|---|---|
| 4,464,636 A * | 8/1984 | Dobrovolny | 330/300 |
| 6,388,546 B1 * | 5/2002 | Kikokawa et al. | 333/218 |
| 6,407,640 B1 * | 6/2002 | Aparin et al. | 330/302 |
| 6,759,908 B2 * | 7/2004 | Gotou et al. | 330/302 |
| 7,199,658 B2 * | 4/2007 | Floyd et al. | 330/251 |
| 7,567,129 B2 * | 7/2009 | Rohani et al. | 330/305 |

* cited by examiner

*Primary Examiner*—Patricia Nguyen
(74) *Attorney, Agent, or Firm*—Pearne & Gordon LLP

(57) ABSTRACT

A low-noise amplifier is provided according to the present invention. The low-noise amplifier includes a first amplifier stage, a second amplifier stage, a third amplifier stage, an input matching network, inter-stage matching networks, and an output matching network. The impedance of the input matching network and the input impedance of the first amplifier stage are conjugate matched, thereby decreasing system power consumption and noise factor. The system gain is enhanced by cascading three stages of amplifiers.

12 Claims, 3 Drawing Sheets

LOW-NOISE AMPLIFIER

BACKGROUND OF THE INVENTION

1. Field of the Invention

This invention generally relates to amplifiers, and more specifically, to a low-voltage, low-power, and low-noise amplifier.

2. Description of Related Art

As consumers are getting more concerned about vehicle driving safety, in addition to antilock brake system (ABS) and air bags of vehicles, a vehicle anti-crash safety system would further enhance driving safety. Millimeter wave radar system is becoming an important technology of vehicle anti-crash safety system, and short-range radar sensor employed in the millimeter wave radar system consists of a transmitter and a receiver. A low-noise amplifier (LNA) is a part of the receiver of the short-range radar sensor. The low-noise amplifier, as a part of the receiver, amplifies received signals and suppresses noises caused by the receiver itself. Therefore, how to design low-noise amplifiers has become an urgent issue.

Wireless communication technology has been rapidly developed, and the production cost of radio frequency (RF) wireless integrated circuit is becoming lower. General prior RF integrated circuits using specific fabrication processes, such as GaAs HEMT and SiGe HBT, not only have high cost, but also are unable to integrate with digital circuits, making system on chip (SOC) infeasible. Therefore, in order to lower production cost as well as integrate both digital circuits and analog circuits, employing designs of low cost CMOS (complementary metal-oxide semiconductor) process has become a trend of future integrated circuit design.

According to "High frequency LNA design in standard CMOS process" (*IEEE Circuits Syst*, pp. 5-8, June 2006, M. Egels, J. Gaubert, and P. Pannier), a low-noise amplifier designed by employing CMOS 0.13 process and operated at K-band is disclosed, the architecture of this low-noise amplifier consists of a common-source amplifier and a cascade amplifier. Compared with a traditional low-noise amplifier that consists of cascade amplifier only, this low-noise amplifier has much lower noise (NF=3.1 dB).

According to "26-42 GHz SOI CMOS low-noise amplifier" (*IEEE J. Solid-State Circuit*, vol. 39, no. 3, pp. 522-528, March 2004, F. Ellinger), a 26-42 GHz low-noise amplifier designed by employing 90 nm SOI CMOS process is disclosed, this low-noise amplifier consists of one cascade amplifier, its noise factor is NF=3.6 dB, but its power consumption is too high (40.8 mW). Also, the SOI process has higher production cost due to an isolation layer to separate active components from substrate in order to reduce power consumption.

According to "A 26 GHz low-noise amplifier in 0.18 μm CMOS technology" (*IEEE Int. Symp. Electron Dev.*, pp. 93-98, November 2003, K. W. Yu et al), a 26 GHz low-noise amplifier designed by employing 0.18 μm CMOS process is disclosed, its architecture consists of three common-source amplifiers that are arranged in a cascade manner; and transistor is used for bias. However, this kind of bias will lower the linearity of amplifier. Since a standard CMOS process is used, of which the substrate has low resistance, signals are likely to couple to substrate via parasitic capacitance. Therefore, thicker upper-layer metal must be used to design inductors in order to reduce ohmic loss.

According to "A Ku-band CMOS low-noise amplifier" (*IEEE Radio Freq. Integ. Tech.*, pp. 183-186, December 2005, K. L. Deng et al), a Ku-band low-noise amplifier designed by employing 0.18 μm CMOS process is disclosed. The architecture of this low-noise amplifier consists of two common-source amplifiers, and low-pass filter circuits are used, hence this low-noise amplifier has rather high power consumption.

According to "A 24 GHz 3.9 dB NF low-noise amplifier using 0.18 μm CMOS technology" (*IEEE Microw. Wireless Comp. Lett.*, vol. 15, no. 7, pp. 448-450, July 2005, S. C. Shin et al), a 24 GHz low-noise amplifier by employing 0.18 μm CMOS process is disclosed, the architecture of this low-noise amplifier consists of two common-source amplifiers, and the bias network of the first stage is integrated with the input matching circuit in order to decrease the sensitivity to noise, hence the noise factor is low (NF=3.9 dB), and its power consumption is 14 mW at 1V power supply voltage.

In view of the above, it is a highly urgent issue in the industry to provide a low-noise amplifier, which has low voltage, low power consumption, and low production cost, thereby effectively solving the drawbacks of the prior arts as mentioned above.

SUMMARY OF THE INVENTION

In view of the disadvantages of the prior arts mentioned above, it is the primary objective of the present invention to provide a low-noise amplifier that has low power consumption and low production cost.

To achieve the aforementioned and other objectives, a low-noise amplifier is provided according to the present invention. The low-noise amplifier includes: an input matching network; a first stage of amplifier having an input end and an output end, the input end being connected to the input matching network, the first stage of amplifier having an input impedance in conjugate matching relation with the impedance of the input matching network; a second stage of amplifier having an input end and an output end; a first inter-stage matching network connected to the output end of the first amplifier stage and the input end of the second amplifier stage, to form a conjugate matching relation between the output impedance of the first amplifier stage and the input impedance of the second amplifier stage; a third stage of amplifier having an input end and an output end; a second inter-stage matching network connected to the output end of the second amplifier stage and the input end of the third amplifier stage, to form a conjugate matching relation between the output impedance of the second amplifier stage and the input impedance of the third amplifier stage; and an output matching network connected to the output end of the third amplifier stage.

The first amplifier stage is a common-source single-transistor amplifier including a first transistor and an inductor. The gate of the first transistor is the input end of the first amplifier stage and is connected to the input matching network. The inductor is connected between the source of the first transistor and the ground.

The input matching network includes a capacitor and an inductor. The capacitor is connected between the radio-frequency signal input end of the low-noise amplifier and the gate of the first transistor. The inductor is connected between the gate of the first transistor and a power supply. The power supply is further connected to a bypass capacitor.

The first inter-stage matching network includes an inductor and a capacitor. The inductor is connected between the drain of the first transistor and another power supply. The capacitor is connected between the drain of the first transistor and the input end of the second amplifier stage. The power supply is further connected to a bypass capacitor.

The second amplifier stage is a common-source single-transistor amplifier including a second transistor, an inductor and a resistor. The gate of the second transistor is the input end of the second amplifier stage and is connected to the first inter-stage matching network. The inductor is connected between the source of the second transistor and the ground. The resistor is connected between the gate of the second transistor and another power supply.

The second inter-stage matching network includes an inductor and a capacitor. The inductor is connected between the drain of the second transistor and a power supply. The capacitor is connected to the drain of the second transistor and the input end of the third amplifier stage. The power supply is further connected to a bypass capacitor.

The third amplifier stage is a common-source single-transistor amplifier including a third transistor, an inductor and a resistor. The gate of the third transistor is the input end of the third amplifier stage and is connected to the second inter-stage matching network. The inductor is connected between the source of the third transistor and the ground. The resistor is connected between the gate of the third transistor and a power supply.

The output matching network includes an inductor and a capacitor. The inductor is connected between the drain of the third transistor and a power supply. The capacitor is connected between the drain of the third transistor and a radio-frequency signal output end of the low-noise amplifier. The power supply is further connected to a bypass capacitor.

In view of the above, the low-noise amplifier of the present invention enhances the system gain via cascading three stages of amplifiers and decreases the system power consumption and noise factor via conjugate matching of impedance between the input matching network and the first amplifier stage, between the first and the second amplifier stages, between the second and the third amplifier stages, as well as between the third amplifier stage and the output matching network.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
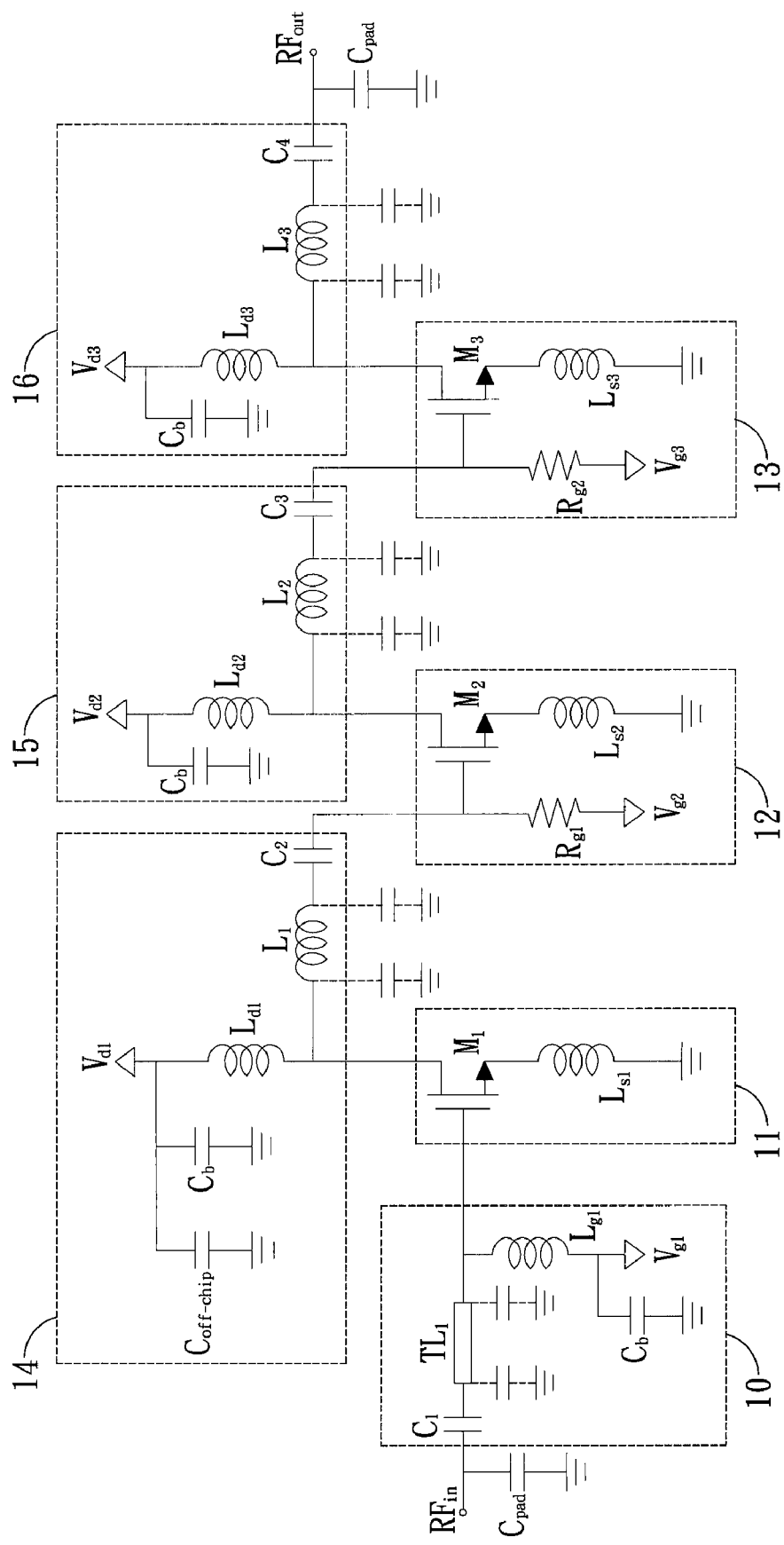
FIG. 1 is an architectural circuit diagram of low-noise amplifier of the present invention.

Please refer to FIG. 1, which is a circuit diagram of the low-noise amplifier of the present invention. The low-noise amplifier comprises an input matching network 10, a first amplifier stage 11, a second amplifier stage 12, a third amplifier stage 13, inter-stage matching networks 14 and 15, and an output matching network 16. Followed are detailed descriptions of the low-noise amplifier of the present invention.

When a radio-frequency electromagnetic signal is guided along an RF circuit, partial reflection and partial transmission may occur. Impedance matching technique must be applied to cause maximum amount of electromagnetic signal to be guided from one circuit block to the next. Therefore, in the design of low-noise amplifier of the present invention, input matching network, inter-stage matching networks and output matching network are designed to decrease reflection of radio-frequency signals along amplifiers of multiple stages.

The input matching network 10 comprises an inductor $L_{g1}$ and a capacitor $C_1$. The input matching network 10 forms a conjugate matching relation with the input impedance of the first amplifier stage 11.

The first amplifier stage 11 comprises a transistor $M_1$. The gate of transistor $M_1$ is the input end of the first amplifier stage 11 and is connected to the input matching network 10. The drain of transistor $M_1$ is the output end of the first amplifier stage 11. The capacitor $C_1$ is connected between the radio-frequency signal input end $RF_{in}$ of the low-noise amplifier of the present invention and the gate of transistor $M_1$. The inductor $L_{g1}$ is connected between the gate of transistor $M_1$ and a power supply of voltage $V_{g1}$. In order to further stabilize the power supply voltage $V_{g1}$, the power supply voltage $V_{g1}$ is further connected to a bypass capacitor $C_b$ to RF noise to the ground. The source of transistor $M_1$ is connected to a ground inductor $L_{s1}$. In the present invention, the power supply voltage $V_{g1}$ provides a bias potential to the gate of transistor $M_1$ via the inductor $L_{g1}$.

The inter-stage matching network 14 is connected between the output end of the first amplifier stage 11 and the input end of the second amplifier stage 12, to form a conjugate matching relation between the output impedance of the first amplifier stage 11 and the input impedance of the second amplifier stage 12.

The inter-stage matching network 14 comprises an inductor $L_{d1}$ and a capacitor $C_2$. The inductor $L_{d1}$ is connected between the drain of transistor $M_1$ and a power supply of voltage $V_{d1}$. The capacitor $C_2$ is connected between the drain of transistor $M_1$ and the input end of the second amplifier stage 12.

The second amplifier stage 12 comprises a transistor $M_2$. The gate of transistor $M_2$ is the input end of the second amplifier stage 12, and the drain of transistor $M_2$ is the output end of the second amplifier stage 12. The capacitor $C_2$ is connected between the drain of transistor $M_1$ and the gate of transistor $M_2$. The gate of transistor $M_2$ is further connected to a power supply of voltage $V_{g2}$ via a resistor $R_{g1}$. The source of transistor $M_2$ is connected to a ground inductor $L_{s2}$.

The inter-stage matching network 15 is connected between the output end of the second amplifier stage 12 and the input end of the third amplifier stage, to form a conjugate matching relation between the output impedance of the second amplifier stage 12 and the input impedance of the third amplifier stage 13. The inter-stage matching network 15 comprises an inductor $L_{d2}$ and a capacitor $C_3$. The inductor $L_{d2}$ is connected between the drain of transistor $M_2$ and a power supply of voltage $V_{d2}$.

The third amplifier stage 13 comprises a transistor $M_3$. The gate of transistor $M_3$ is the input end of the third amplifier stage 13, and the drain of transistor $M_3$ is the output end of the third amplifier stage 13. The capacitor $C_3$ is connected between the drain of transistor $M_2$ and the gate of transistor $M_3$. The gate of transistor $M_3$ is further connected to a power supply of voltage $V_{g3}$ via a resistor $R_{g2}$. The source of transistor $M_3$ is connected to a ground inductor $L_{s3}$.

The output matching network 16 is connected to the output end of the third amplifier stage 13 and the radio-frequency signal output end $RF_{out}$ of the low-noise amplifier of the present invention, to form a conjugate matching relation with the output impedance of the third amplifier stage 13.

The output matching network 16 comprises an inductor $L_{d3}$ and a capacitor $C_4$. The inductor $L_{d3}$ is connected between the drain of transistor $M_3$ and a power supply of voltage $V_{d3}$. The capacitor $C_4$ is connected between the drain of transistor $M_3$ and the radio-frequency signal output end $RF_{out}$ of the low-noise amplifier of the present invention.

The low-noise amplifier of the present invention is a low-noise amplifier that employs 0.18 μm CMOS process design and is applicable to a 24 GHz short-range radar sensor system. In a preferable embodiment of the present invention, the transistors $M_1$, $M_2$, and $M_3$ are metal-oxide-semiconductor field-effect transistor (MOSFET) components. However, in circuit designs, bipolar junction transistors (BJT) or other active components with amplifying capability can also be applied to the architecture as shown in FIG. 1.

In order to reach the objective of low voltage, low power consumption, and high gain, proper size of transistors ($M_1$, $M_2$, and $M_3$) is selected in the design process of the low-noise amplifier of the present invention. Followed are detailed descriptions of design process of the low-noise amplifier of the present invention.

In a main architecture of low-noise amplifier that has cascaded common-source amplifiers of three stages, design of its first amplifier stage is especially important. I In order to satisfy noise matching and power matching, the design must satisfy conditions listed below:

$$Re(Zs)=Re(Zopt)=50\Omega \quad (1)$$

$$Zin=Z^*s=Z^*opt \quad (2)$$

wherein, Zs is the impedance of the input matching network 10, Zopt is a preferable source impedance, and Zin is the input impedance of the first amplifier stage 11.

In the design process, in order to satisfy equations (1) and (2), proper tailoring of size of the transistor $M_1$ and the inductance of inductor $L_{s1}$ connected to the source of transistor $M_1$ is a required procedure, which can not only satisfy the foresaid conditions but also achieve smaller bias current, thereby reducing direct-current power consumption of amplifier; and since Zin is a function of frequency, noise matching and power matching can be achieved simultaneously at a specific frequency band.

In the design of 24 GHz low-noise amplifier of the present invention, in order to lower power consumption, transistor $M_1$ has 11 fingers, the total length of gate is 33 μm, the bias voltage is 1V, and the drain current is 3 mA.

As shown in FIG. 1, the inductor $L_{g1}$ and the capacitor $C_1$ form the conjugate matching relation with Zin, higher gain of the first amplifier stage 11 is helpful in suppressing noise of the next amplifier stage, thereby achieving lower noise performance. In the present invention, the inductance of inductor $L_{g1}$ is 0.28 nH and the capacitance of capacitor $C_1$ is 112.3 pF.

In the radio frequency, gain of an amplifier stage of single transistor is not enough; therefore in the present invention, the second and the third amplifier stages 12 and 13 are designed to increase the system gain of the low-noise amplifier. Meanwhile the inter-stage matching networks 14 and 15 are designed as band-pass filter of LC resonant circuits, using $L_{d1}$, $C_2$, $L_{d2}$, and $C_3$ as shown in FIG. 1, and the sizes of transistors $M_2$ and $M_3$ are designed to achieve maximum power gain.

It should be understood to those in the art that when the signal frequency is increased high enough, stray capacitance, bypass capacitance, or other effects of transistors will become important factors in affecting the system performance.

As shown in FIG. 1, in order to enhance stability of the drain bias of transistors $M_1$, $M_2$, and $M_3$, the foresaid power supply voltages $V_{d1}$, $V_{d2}$, and $V_{d3}$ are each connected to a bypass capacitor $C_b$, respectively.

In addition, due to process tolerances, oscillation is likely to happen to low-noise amplifier at some unpredictable frequencies; and due to feedback of transistor drain voltage, low-noise amplifier will become unstable. In order to solve foresaid problems, design of the present invention provides drain bias networks of the transistors $M_1$, $M_2$, and $M_3$ with power supply voltages $V_{d1}$, $V_{d2}$, and $V_{d3}$, respectively; furthermore, in order to eliminate oscillation via parasitic capacitor $C_{ds}$ between source and drain of transistor in low frequencies, in the design of the present invention, drain bias network of the transistor $M_1$ is connected in parallel to a capacitor $C_{off-chip}$ to bypass low-frequency signals.

Furthermore, at radio frequencies, inductance effect of signal transmission line in circuit of low-noise amplifier can not be ignored. As shown in FIG. 1, inductors $L_1$, $L_2$, and $L_3$ are added to circuit; in addition, parasitic capacitor $C_{pad}$ of connection pads at radio-frequency signal input, output ends of low-noise amplifier cannot be ignored either.

The 24 GHz low-noise amplifier is fabricated via 0.18 μm CMOS process, and fabricated chip size is 0.64 mm*0.48 mm; to test performance of the low-noise amplifier of the present invention, the input end and the output end of the low-noise amplifier are measured by means of high frequency probe, direct-current power source and ground capacitor connection pads are tested via wire connecting to testing pads, reflection coefficient S of input and output ends is measured via HP 8510 network analyzer, and noise factor (NF) is measured via Agilent N8975A noise factor tester.

Figure 2:
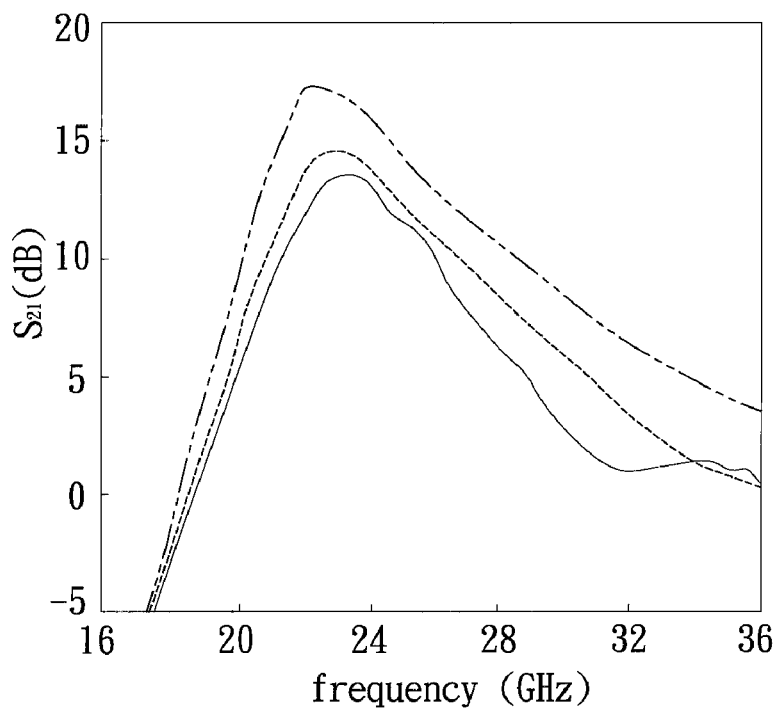
FIG. 2 is a chart of power gain curves of low-noise amplifier of the present invention.
Figure 3:
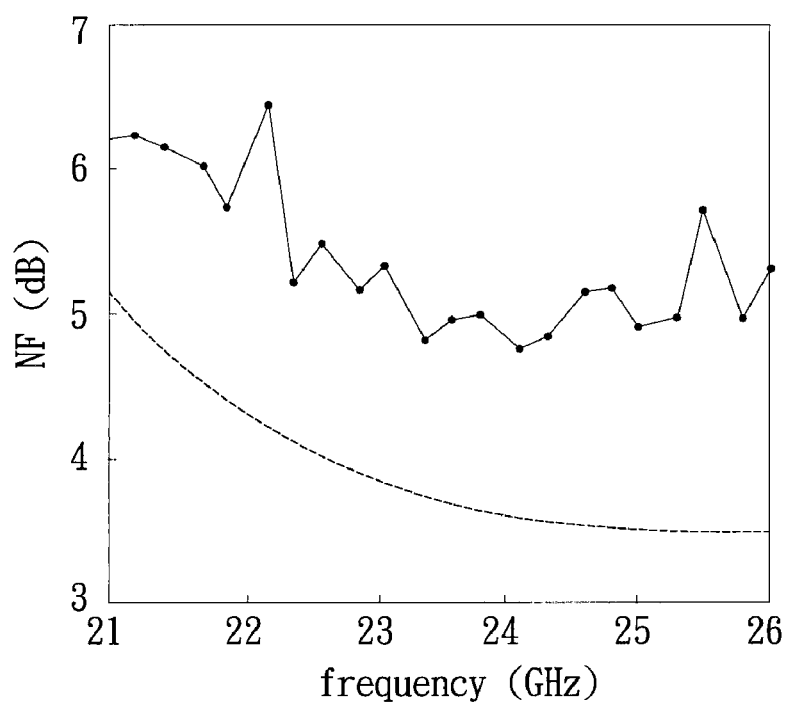
FIG. 3 is a chart of noise factor curves of low-noise amplifier of the present invention.

Please refer to FIGS. 2 and 3, which illustrate power gains and noise factors, respectively, of the low-noise amplifier of the present invention. As shown in FIG. 2, at frequency of 24 GHz, power gain reaches a maximum value of 13.5 dB, it has a bandwidth from 21 GHz to 26 GHz; and as shown in FIG. 3, at frequency of 24 GHz, the NF reaches a minimum value of 4.7 dB.

Figure 4:
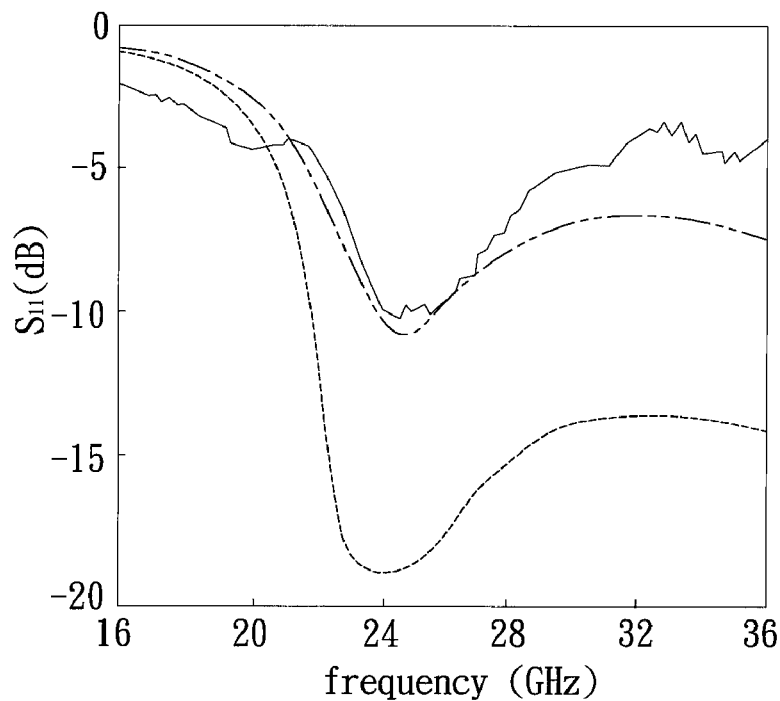
FIG. 4 is a chart of input reflection coefficient curves of low-noise amplifier of the present invention.
Figure 5:
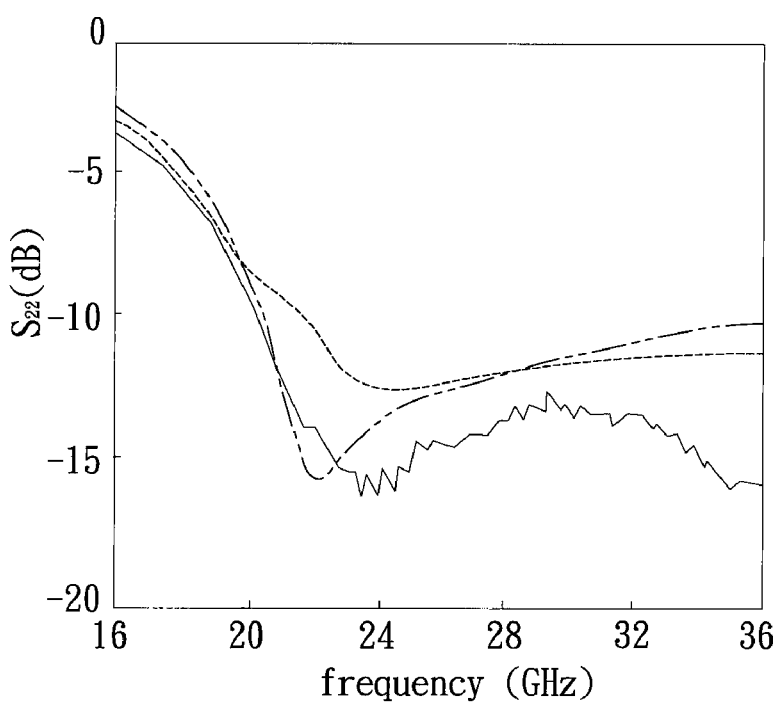
FIG. 5 is a chart of output reflection coefficient curves of low-noise amplifier of the present invention.

Please refer to FIGS. 4 and 5, which illustrate the input reflection coefficient $S_{11}$ and the output reflection coefficient $S_{22}$, respectively, of the low-noise amplifier of the present invention; as shown in the FIGS., at frequency of 24 GHz, both input an output reflection coefficients are below −10 dB; and at 1V power supply voltage, the direct-current power consumption is 8.3 mW.

In view of the above, the low-noise amplifier of the present invention enhances its system gain mainly via cascading three common-source amplifier stages, and the size of transistor $M_1$ of the first amplifier stage is selected by proper tailoring technique, thus smaller transistor size is employed to achieve conjugating matching of the source impedance Zs of the low-noise amplifier and the input impedance Zin of the first amplifier stage; in the present invention, the inductor $L_{g1}$ and the capacitor $C_1$ of the input matching network are gate bias network of the transistor $M_1$ and direct current block, respectively; also the bypass capacitor $C_b$ is connected in parallel to the power supply of voltage $V_{g1}$ for isolating RF noise, therefore, there is no need of extra bias network, such as huge series resistors or huge blocking capacitors, also the low-noise amplifier can further be reduced to smaller size in order to reduce the noise factor; and since the size of transistor $M_1$ is smaller, the power consumption can be further reduced.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A low-noise amplifier comprising:
    an input matching network;
    a first amplifier stage having an input end and an output end, the input end being connected to the input matching network, the first amplifier stage having an input impedance in conjugate matching relation with the impedance of the input matching network;
    a second amplifier stage having an input end and an output end;
    a first inter-stage matching network connected to the output end of the first amplifier stage and the input end of the second amplifier stage, to form a conjugate matching relation between the output impedance of the first amplifier stage and the input impedance of the second amplifier stage;
    a third amplifier stage having an input end and an output end;
    a second inter-stage matching network connected to the output end of the second amplifier stage and the input end of the third amplifier stage, to form a conjugate matching relation between the output impedance of the second amplifier stage and the input impedance of the third amplifier stage; and
    an output matching network connected to the output end of the third amplifier stage.

2. The low-noise amplifier of claim 1, wherein the first amplifier stage is a common-source single-transistor amplifier comprising:
    a first transistor having a gate connected to the input matching network, the gate being the input end of the first amplifier stage; and
    an inductor connected between the source of the first transistor and the ground.

3. The low-noise amplifier of claim 2, wherein the input matching network comprises:
    a capacitor connected between a radio-frequency signal input end of the low-noise amplifier and the gate of the first transistor; and
    an inductor connected between the gate of the first transistor and a power supply.

4. The low-noise amplifier of claim 3, wherein the power supply is further connected to a bypass capacitor.

5. The low-noise amplifier of claim 2, wherein the first inter-stage matching network comprises:
    an inductor connected to the drain of the first transistor and a power supply; and
    a capacitor connected to the drain of the first transistor and the input end of the second amplifier stage.

6. The low-noise amplifier of claim 5, wherein the power supply is further connected to a bypass capacitor.

7. The low-noise amplifier of claim 1, wherein the second amplifier stage is a common-source single-transistor amplifier comprising:
    a second transistor having the gate connected to the first inter-stage matching network, the gate of the second transistor being the input end of the second amplifier stage;
    an inductor connected between the source of the second transistor and the ground; and
    a resistor connected between the gate of the second transistor and a power supply.

8. The low-noise amplifier of claim 7, wherein the second inter-stage matching network comprises:
    an inductor connected between the drain of the second transistor and a power supply; and
    a capacitor connected to the drain of the second transistor and the input end of the third amplifier stage.

9. The low-noise amplifier of claim 8, wherein the power supply is further connected to a bypass capacitor.

10. The low-noise amplifier of claim 1, wherein the third amplifier stage is a common-source single-transistor amplifier comprising:
    a third transistor having the gate connected to the second inter-stage matching network, the gate of the third transistor being the input end of the third amplifier stage;
    an inductor connected between the source of the third transistor and the ground; and
    a resistor connected between the gate of the third transistor and a power supply.

11. The low-noise amplifier of claim 10, wherein the output matching network comprises:
    an inductor connected between the drain of the third transistor and a power supply; and
    a capacitor connected to the drain of the third transistor and the radio-frequency signal output end of the low-noise amplifier.

12. The low-noise amplifier of claim 11, wherein the power supply is further connected to a bypass capacitor.

* * * * *